United States Patent
Barba Jimenez

(10) Patent No.: US 9,739,807 B2
(45) Date of Patent: Aug. 22, 2017

(54) VOLTAGE SENSOR WITH A CAPACITIVE VOLTAGE TRANSFORMER

(71) Applicant: SCHNEIDER ELECTRIC USA, INC., Palatine, IL (US)

(72) Inventor: Eduardo Barba Jimenez, Grenoble (FR)

(73) Assignee: Schneider Electric USA, Inc., Andover, MA (US)

( * ) Notice: Subject to any disclaimer, the term of this patent is extended or adjusted under 35 U.S.C. 154(b) by 55 days.

(21) Appl. No.: 14/818,561

(22) Filed: Aug. 5, 2015

(65) Prior Publication Data
US 2017/0038414 A1 Feb. 9, 2017

(51) Int. Cl.
G01R 15/18 (2006.01)
G01R 19/00 (2006.01)

(52) U.S. Cl.
CPC ......... *G01R 15/18* (2013.01); *G01R 19/0084* (2013.01)

(58) Field of Classification Search
CPC ......... G01R 15/16; G01R 15/06; G01R 1/44; H02B 13/0356; H02M 5/08; H01F 2029/143; H01F 27/04; H01F 27/40; H01F 30/10; H01F 38/26
See application file for complete search history.

(56) References Cited

U.S. PATENT DOCUMENTS

| | | | |
|---|---|---|---|
| 3,829,742 A * | 8/1974 | Muller | G01R 15/16 174/28 |
| 4,074,193 A | 2/1978 | Kohler | |
| 4,591,783 A * | 5/1986 | Mastner | H01G 4/40 324/126 |
| 6,727,791 B2 * | 4/2004 | Zhou | G01R 15/06 323/355 |
| 8,395,397 B1 | 3/2013 | Handshoe et al. | |
| 2012/0098519 A1 | 4/2012 | Juds et al. | |

FOREIGN PATENT DOCUMENTS

CA 2007665 7/1990
WO WO 2009/068047 A1 * 6/2009

* cited by examiner

*Primary Examiner* — Vinh Nguyen
(74) *Attorney, Agent, or Firm* — Locke Lord LLP

(57) ABSTRACT

Two cylindrical capacitors of different values are created in series within a single dielectric resin body to form a capacitive voltage divider for a Medium Voltage sensor. By eliminating temperature variance both capacitors' permittivity is the same, and consistent measurements may be achieved. A first capacitor in the picofarad capacitance range is formed by a rod-shaped central primary conductor, one layer of a wrapped foil capacitor as a second conductor, and the resin body as a dielectric. The wrapped foil capacitor provides a second capacitor in the nanofarad capacitance range and is also embedded within the resin body. The resin body provides a dielectric material almost impervious to ambient changes in operating range and allows for a compact design. A precision resistor can be added in parallel to the first and second capacitors to damp transients and increase the transformation ratio.

12 Claims, 3 Drawing Sheets

VOLTAGE SENSOR WITH A CAPACITIVE VOLTAGE TRANSFORMER

FIELD OF THE INVENTION

The present invention is related to capacitive voltage transformers (CVTs), also known as capacitive voltage dividers, and especially to CVTs useful for metering applications in medium voltage (MV) environments.

BACKGROUND OF THE INVENTION

Smart power grids require large quantities of current and voltage metering sensors to track power flows, to get a voltage proportional to the one being measured, and take intelligent actions.

Known approaches to metering sensors in MV switchgear include using traditional magnetic core Voltage Transformers (VTs) which use electromagnetic induction but suffer from high weight, expense, and large space requirements and are limited in the voltage they can read because of the saturation of their ferromagnetic core.

Resistive divider technology can also be used but suffers from measurement accuracy concerns at higher voltages due to e.g. Johnson-Nyquist noise, thermocouple effects, and susceptibility to parasitic capacitances.

Capacitive voltage transformers exist and are commonly used in Medium and High voltage as voltage presence indicators or for voltage metering. However, the known transformers for metering MV are large, e.g. several meters high, and expensive. Further, known capacitive voltage dividers may have accuracy problems due to the variation of capacitance values caused by changes in ambient conditions such as temperature and humidity. Capacitive voltage transformers for voltage presence indication, such as U.S. Pat. No. 8,395,397 to Handshoe et al., are small but possess little accuracy. They generally serve merely to light up an LED that indicates voltage presence.

Therefore, there is a desire for a compact, accurate, capacitive voltage divider based metering sensor for MV and HV applications.

SUMMARY OF THE DISCLOSED EMBODIMENTS

The present invention addresses these needs by providing a compact design where the two capacitors required for voltage transformation are embedded in a single dielectric encapsulation cast in an optimized geometrical configuration where the effect of ambient conditions on accuracy is strongly diminished, thus supporting practical MV metering functions at reasonable cost. Two cylindrical capacitors of different values are embedded within a dielectric resin to form a capacitive voltage divider. Addition of a parallel precision resistor on the secondary will damp transients and increase the transformation ratio. The divider will provide an output voltage proportional to the input voltage, thus creating an Capacitive Voltage Transformer.

Two cylindrical capacitors of different values are formed within a dielectric resin to create a capacitive voltage divider. When two capacitors connected in series are subjected to the same temperature and made of the same material, the permittivity (dielectric property of insulators) becomes a common factor and thus can be eliminated out of the equation that describes the voltage transformation ratio. With this done, the transformation ratio is only dependent on the geometric construction of the capacitors. This can allow for constructing a very accurate sensing device. Further, the geometric design can be optimized taking into account the insulation resistance required to achieve the desired performance characteristics. One application for this device is in metering Medium Voltage (MV) switchgear. Thus, certain tests like power-frequency withstand (Hi-Pot) and Basic Impulse Level (BIL) should be considered when making a compact design according to the present invention. The device may include electromagnetic shielding to eliminate the electromagnetic effects of any electrical source different from the one being measured.

The exemplary combination of capacitive arrays has two different-value capacitors made of the same material in the same cast body to eliminate dependence on ambient conditions and other material variability. Incorporating a highly stable dielectric material almost impervious to ambient changes in operating range (−40° C. to 150 C.°) allows for a compact design. The present invention presents novel improvements to the capacitor design which reduce parasitic capacitances and temperature gradients, and may drastically increase transformation ratio between input and output voltages. With an added parallel resistor, a high transformation ratio between input and output of the voltage transformer of e.g. 15000:5V could be expected.

In some aspects, the present invention presents a capacitive voltage sensor comprising a cast body composed of a first dielectric material; a center conductor rod in the cast body; a wrapped foil capacitor in the cast body, the wrapped foil capacitor wrapped to concentrically surround a portion of the center conductor rod, the wrapped foil capacitor having a near-side conductive foil layer facing the center conductor rod, a far-side conductive foil layer at a farther radial distance from the center conductor rod; and a layer of a second dielectric material facing each conductive foil layer; whereby a first capacitor of smaller capacity is formed between the center conductor rod and the near-side conductive foil layer, and a second capacitor of larger capacity is formed by the wrapped foil capacitor in series with the first capacitor; where the near-side conductive foil layer is electrically floated and the far-side conductive foil layer is electrically grounded, thus creating two series-connected capacitances; an input terminal for connecting the center conductor rod to a conductor to be sensed; an voltage output terminal on the cast body electrically connected to the near-side conductive foil layer for outputting a transformed voltage; and a grounding terminal on the cast body electrically connected to the far-side conductive foil layer.

Thus, a CVT or accompanying sensor apparatus according to the present invention may offer advantages including: measurement sensitivity to ambient temperature and humidity is reduced, a compact design while maintaining dielectric strength, overall cost reduction compared to traditional VTs, the device is lighter than a traditional VT, is easier to manufacture and install, and with higher capacitance values embedded in a small space makes electronic signal processing easier with less circuit loading.

BRIEF DESCRIPTION OF THE DRAWINGS

The foregoing and other advantages of the disclosed embodiments will become apparent upon reading the following detailed description and upon reference to the exemplary drawings according to one or more embodiments disclosed herein, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
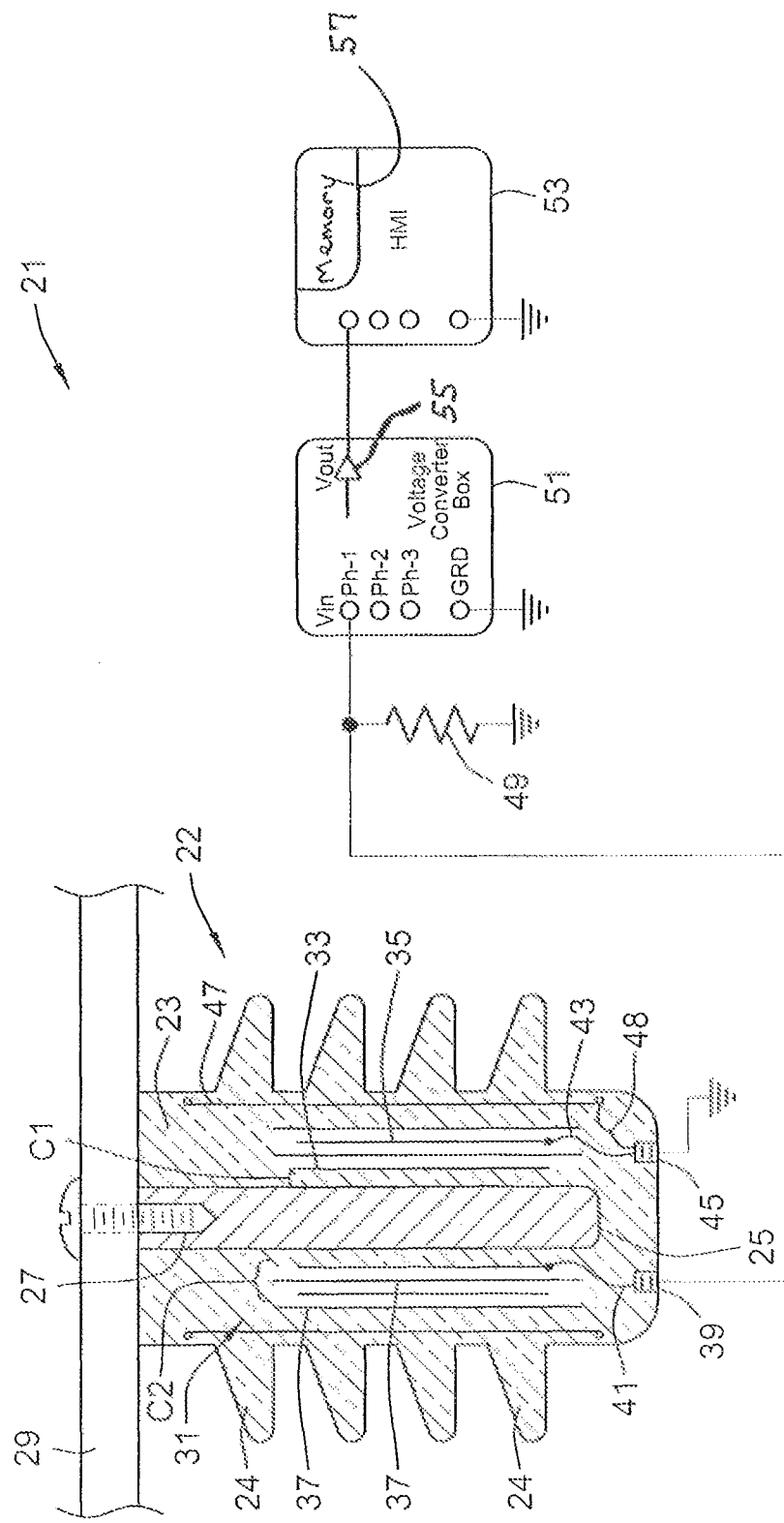
FIG. 1 is a longitudinal cross section through the cast body of the capacitive voltage divider structure which also schematically shows the electronic components for metering voltages together with the core body.
Figure 2:
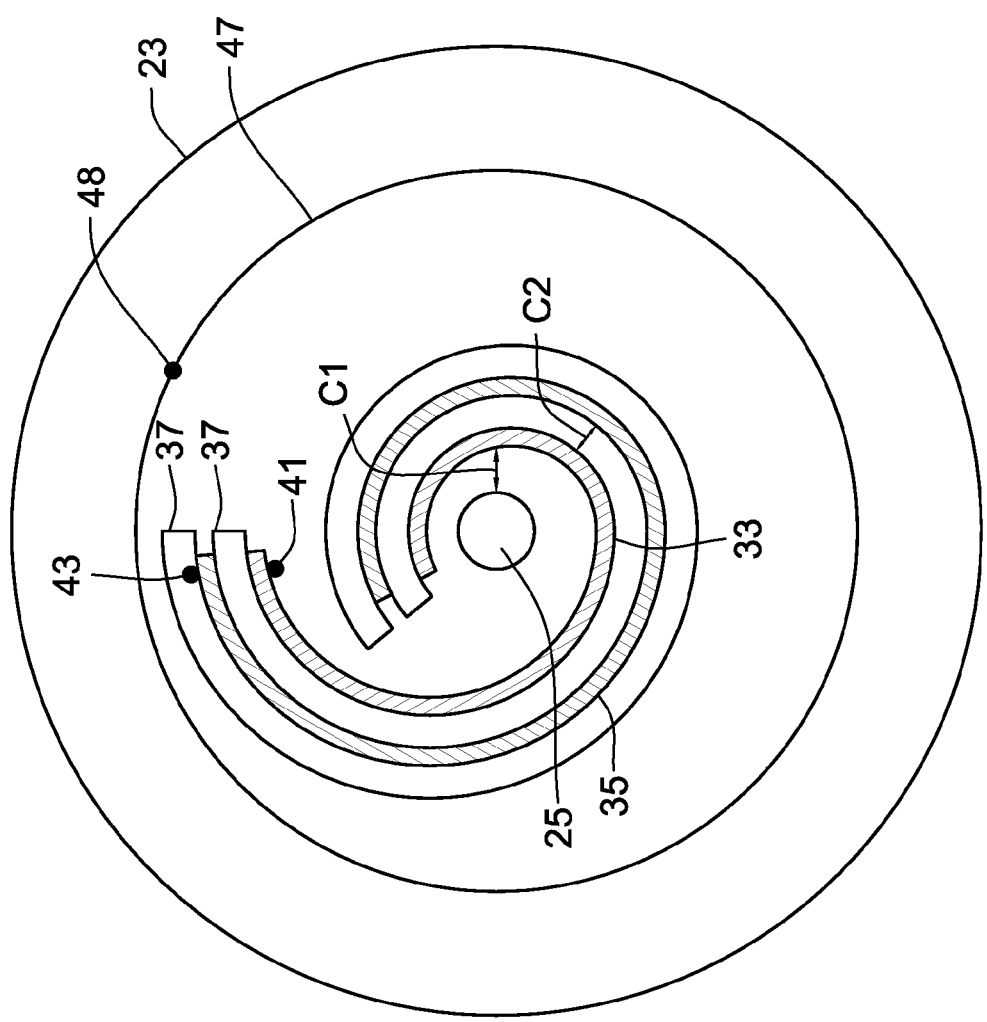
FIG. 2 is a radial cross section through the cast body of the capacitive voltage divider structure showing the concentric nature of the construction for the capacitors therein.

Referring particularly to FIGS. 1 and 2, a capacitive voltage sensor 21 for metering MV electrical applications comprises a capacitive voltage divider 22 with a cast body 23 formed with tracking sheds 24 and composed of a first dielectric material, such as PTFE resin, e.g. TEFLON®, or an epoxy resin such as ARALDITE B®, surrounding a center conductor rod 25 connected to a voltage input terminal 27 providing access to the exterior of the cast body 23 for connection to a medium voltage conductor 29, such as a bus bar or the like.

A wrapped foil capacitor 31 is encased in the cast body 23, the wrapped foil capacitor wrapped or wound to concentrically surround at least a portion of the length of the center conductor rod 25. The wrapped foil capacitor 31 comprises at least two layers of conductive foil 33, 35 such as aluminum, each backed by a layer collectively 37 of a second dielectric material such as a MYLAR® film. As wrapped around the center conductive rod 25 the foils 33, 35 produce a near-side conductive foil layer 33 facing the center conductor rod, and a far-side conductive foil layer 35 at a farther radial distance from the center conductor rod.

Thus within the cast body 23 there is arranged the plates for a first capacitor C1 of smaller capacity (pF range) as formed between the center conductor rod 23 and the near-side conductive foil layer 33; while the layers of the wrapped foil capacitor 31 form a second capacitor C2 of larger capacity (nF range) in series with the first capacitor. The near-side conductive foil layer 33 is electrically floated, i.e. not grounded and not tied to any established potential, and is connected by a first wire 41 to an output terminal 39 supplying the transformed, i.e. divided, voltage to the outside of the cast body 23. The far-side conductive foil layer 35 is connected by a second wire 43 to a ground terminal 45 for supplying electrically grounded connections. Thus there is created two series-connected capacitances C1 and C2 within the cast body 23 with a transformed (divided) voltage between them at the output terminal 39. A concentric metal mesh screen electromagnetic shield 47 with rounded edges surrounds C1 and C2 and is connected by a third wire 48 to the ground terminal 45 for shielding electromagnetic interference from secondary sources.

A precision resistor 49 is connected in parallel to C2 across the output voltage and ground, preferably outside of the cast body 23. The precision resistor enables easier control of transformation ratio between the input and output voltage signals. The transformation ratio for a given class of device can be easily controlled by selecting the number of winding turns (layers) of the double sided capacitor film of C2 and selection of the precision resistor values. It will be noted that precision resistors typically have extremely limited sensitivity to temperature, but may cause a small phasing offset between the input and output voltage signals, usually less than 1° electrical degree, although exact values will depend on the value of the resistance. The output terminal 39 is further connected to the input terminal of a voltage converter box 51, which does the voltage amplification, as at amplifier 55. The voltage converter box is a device whose function is to take the voltage signal from the capacitive voltage divider 22, i.e. the transformer; which is usually in the 0 to 3.25V range and convert it to a 0-120V to allow compatibility with a voltage meter human/machine interface (HMI) 53 or further control means such a relay or the like (not shown). The human/machine interface may have, e.g., an output indicator for metering, and a memory 57 for recording, the sensed voltage to further increase its utility. The voltage converter box 51 might be of a commercially available type like a CAPDIS 4-o from Kries-Energytechnik GmbH & Co. (Kries.com).

Figure 3:
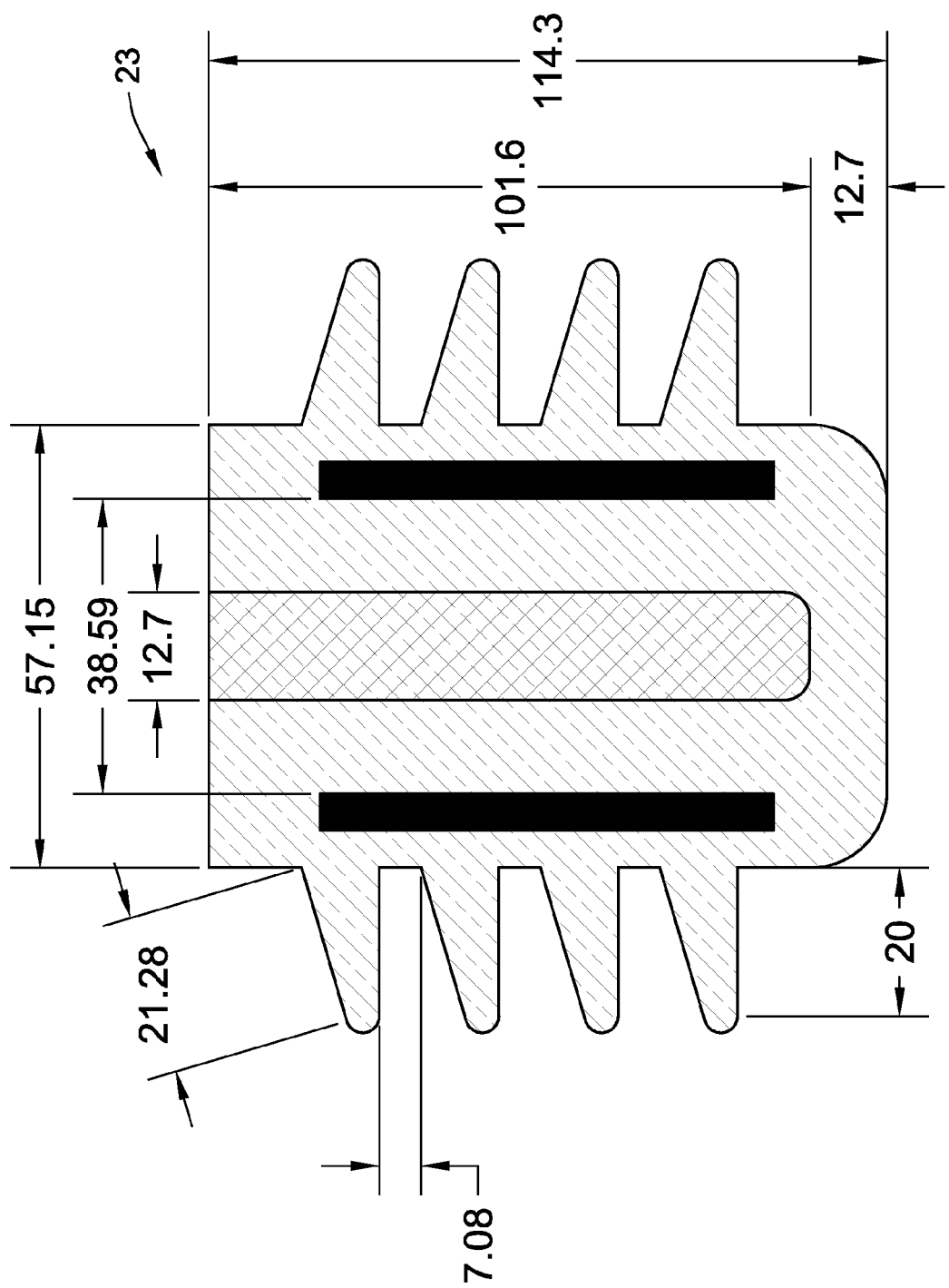
FIG. 3 is a schematic representation of a model capacitive voltage divider with exemplary dimensions shown.

As seen in FIG. 3, an exemplary unit of a Capacitive Voltage Transformer cast body 23 with suggested dimensions is illustrated. Dielectrically optimized dimensions and physical construction of two capacitors will enable a reduced temperature gradient on the capacitive divider thus diminishing the effect of temperature on the transformation ratio, i.e. output. Each dimension and material selection may affect performance. Among the main considerations in constructing a unit according to the present invention are the dimensions of the cylindrical radiuses of the conductors and the relative permittivity of the dielectric material between them.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the scope of the disclosed embodiments as defined in the appended claims.

What is claimed is:

1. A capacitive voltage sensor comprising:
   a) a cast body composed of a first dielectric material;
   b) a center conductor rod in the cast body;
   c) a wrapped foil capacitor in the cast body, the wrapped foil capacitor wrapped to concentrically surround a portion of the center conductor rod, the wrapped foil capacitor having a near-side conductive foil layer facing the center conductor rod, a far-side conductive foil layer at a farther radial distance from the center conductor rod, and a layer of a second dielectric material facing each conductive foil layer;

d) whereby a first capacitor of smaller capacity is formed between the center conductor rod and the near-side conductive foil layer, e) and a second capacitor of larger capacity is formed by the wrapped foil capacitor in series with the first capacitor; where the near-side conductive foil layer is electrically floated and the far-side conductive foil layer is electrically grounded, thus creating two series-connected capacitances;

f) an input terminal for connecting the center conductor rod to a conductor to be sensed;

g) an voltage output terminal on the cast body electrically connected to the near-side conductive foil layer for outputting a transformed voltage; and h) a grounding terminal on the cast body electrically connected to the far-side conductive foil layer.

2. The capacitive voltage sensor of claim 1 wherein the first dielectric material is an epoxy.

3. The capacitive voltage sensor of claim 1 wherein the wrapped foil capacitor is wrapped to concentrically surround the center conductor rod.

4. The capacitive voltage sensor of claim 1 further comprising a shielding screen around the capacitors which is connected to the grounding terminal.

5. The capacitive voltage sensor of claim 1 further comprising a precision resistor in parallel with the voltage output terminal.

6. The capacitive voltage sensor of claim 1 further comprising a human/machine interface for making available the transformed voltage to a user or a control apparatus.

7. The capacitive voltage sensor of claim 6 wherein the human/machine interface has an output indicator for metering and a memory for recording the sensed voltage.

8. The capacitive voltage sensor of claim 1 further comprising the cast body having tracking sheds thereon.

9. The capacitive voltage sensor of claim 1 wherein the first capacitor is in the picofarad range.

10. The capacitive voltage sensor of claim 1 wherein the second capacitor is in the nanofarad range.

11. The capacitive voltage sensor of claim 1 further comprising: an amplifier connected to the transformed voltage.

12. The capacitive voltage sensor of claim 11 further comprising: a resistor connected across an input of the amplifier, and a volt meter connected to an output of the amplifier.

* * * * *